United States Patent [19]

Egusa

[11] Patent Number: 5,093,698
[45] Date of Patent: Mar. 3, 1992

[54] ORGANIC ELECTROLUMINESCENT DEVICE

[75] Inventor: Syun Egusa, Yokohama, Japan

[73] Assignee: Kabushiki Kaisha Toshiba, Kawasaki, Japan

[21] Appl. No.: 654,052

[22] Filed: Feb. 12, 1991

[51] Int. Cl.$^5$ .............................................. H01L 33/00
[52] U.S. Cl. ........................................ 357/17; 357/8; 357/16
[58] Field of Search ................................ 357/17, 8, 16

[56] References Cited

U.S. PATENT DOCUMENTS

| | | | |
|---|---|---|---|
| 4,539,507 | 9/1985 | Van Slyke et al. | 357/8 X |
| 4,720,432 | 1/1988 | Van Slyke et al. | 357/8 X |
| 4,885,211 | 12/1989 | Tang et al. | 357/8 X |

FOREIGN PATENT DOCUMENTS

| | | |
|---|---|---|
| 57-51781 | 7/1981 | Japan . |
| 6137891 | 7/1984 | Japan . |
| 61-43685 | 3/1986 | Japan . |
| 61-44987 | 3/1986 | Japan . |

OTHER PUBLICATIONS

J. Appl. Phys., vol. 54, (5), Martin et al., May, 1983, pp. 2792-2794, "Influence of Dioxygen on the Junction Properties of Metallophthalocyanine Based Devices".

Tang et al., "Organic Electroluminescent Diodes," Appl. Phys. Lett. 51 (12), Sep. 21, 1987, pp. 913-915.
"Electroluminescence of Perylene Films with a Conducting Polymer qs an Anode" Hayashi et al., Japanese Journal of Applied Physics, vol. 25, No. 9, 9/86, pp. L773-L775.
"Electroluminescence of Doped Organic Thin Films", Tang et al., J. Appl. Phys. 65(0), May 1, 1989, pp. 3610-3616.
"Organic Electroluminescent Diodes", Appl. Phys. Lett. 51 (12), Sep. 21, 1987, Tang et al., pp. 913-915.

Primary Examiner—William Mintel
Attorney, Agent, or Firm—Oblon, Spivak, McClelland, Maier & Neustadt

[57] ABSTRACT

An organic electroluminescent device is constituted by first and second electrodes opposing each other and a multilayered body having a plurality of organic films sandwiched between the electrodes and including an electroluminescent layer. A donor impurity is doped in a first organic film in contact with the first electrode, and an acceptor impurity is doped in a second organic film in contact with the second electrode. A third organic film sandwiched between the first and second organic films serves as an electroluminescent layer. A material having a band gap narrower than those of the first and second organic films is selected as a material of the third organic film so as to confine carriers. No impurity is doped in the third organic film.

11 Claims, 12 Drawing Sheets

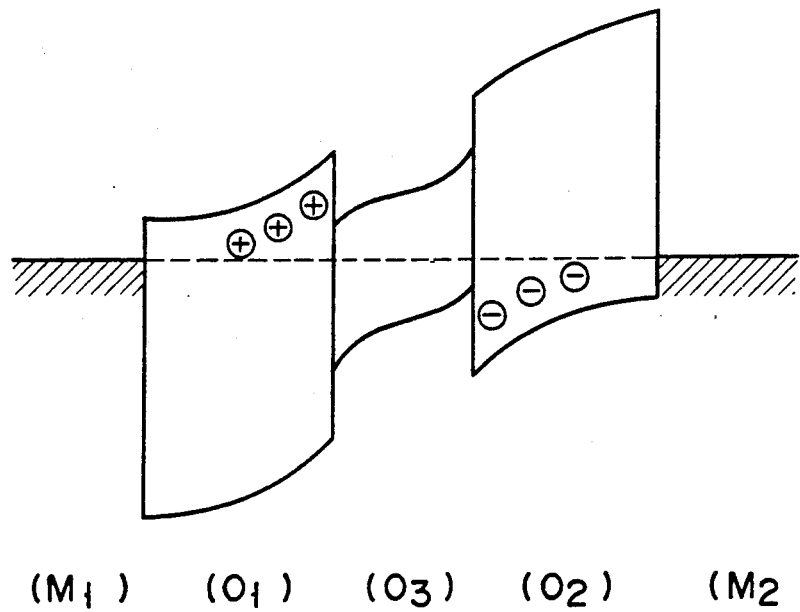
($M_1$) ($O_1$) ($O_3$) ($O_2$) ($M_2$)
F I G. 3A
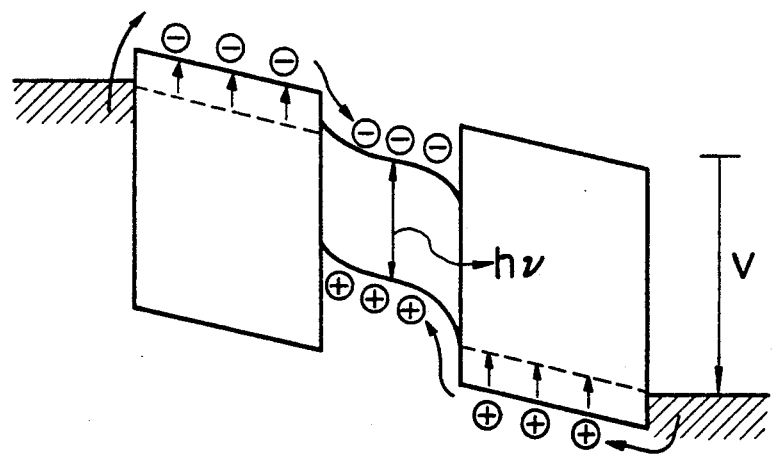
F I G. 3B

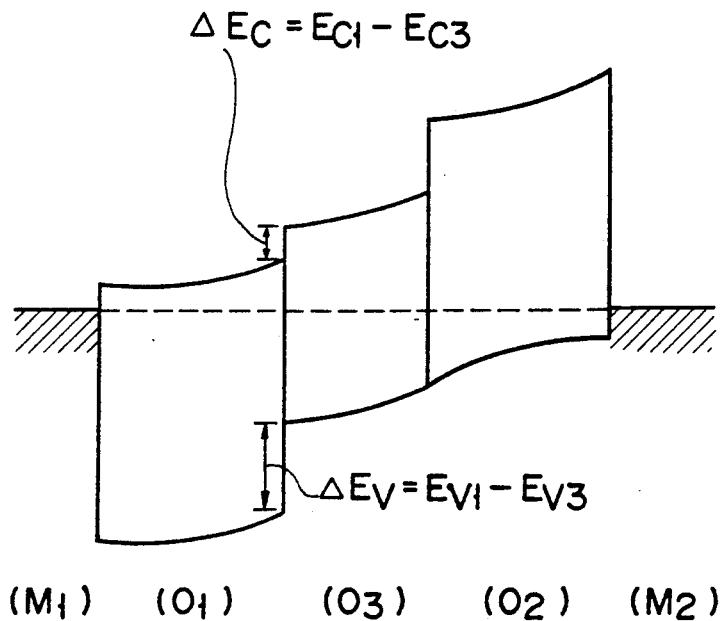
(M₁)  (O₁)   (O₃)   (O₂)  (M₂)
F I G. 5A
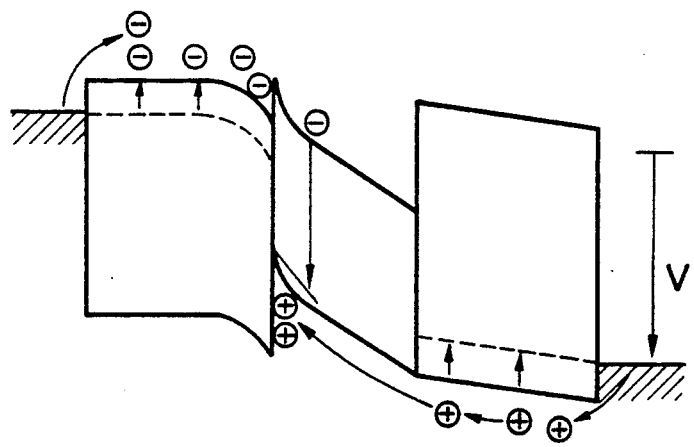
F I G. 5B $(M_1)\quad(O_1)\quad(O_2)\quad(M_2)$ $(M_1)\quad(O_1)\quad(O_2)\quad(M_2)$ $(M_1)\quad(O_1)\quad(O_2)\quad(M_2)$

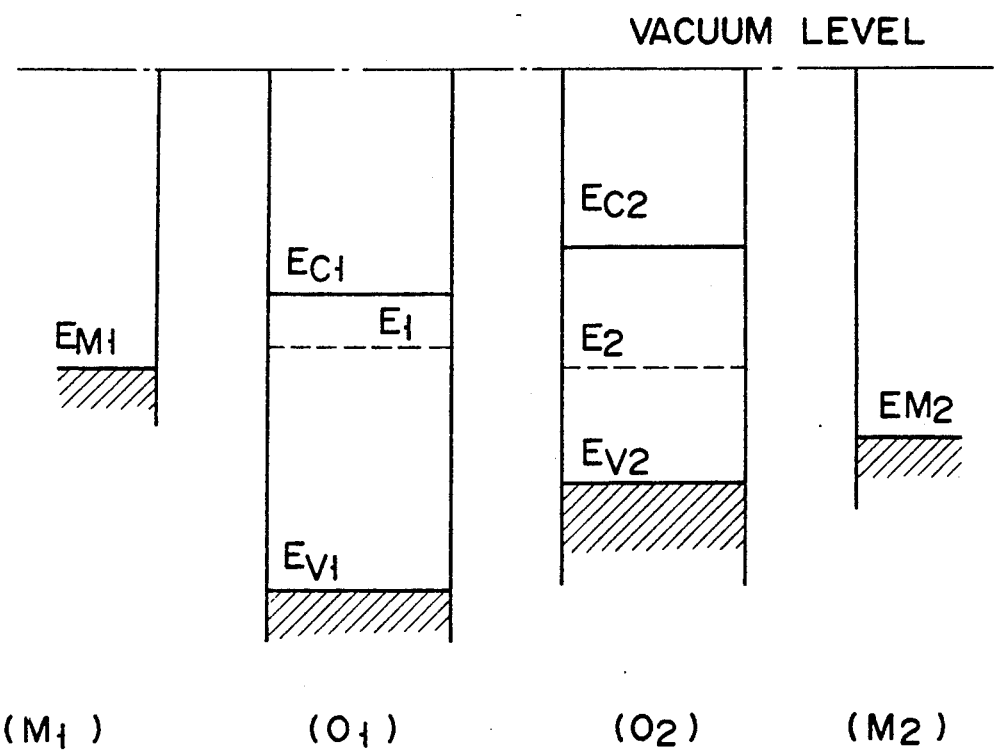
F I G. 12

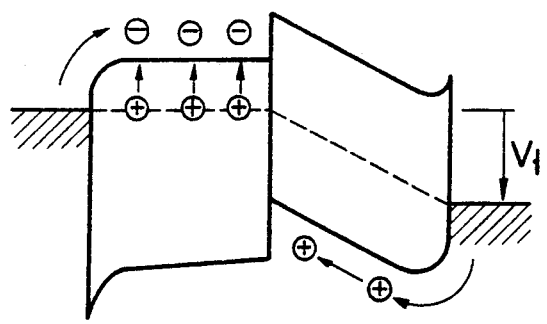
F I G. 13A
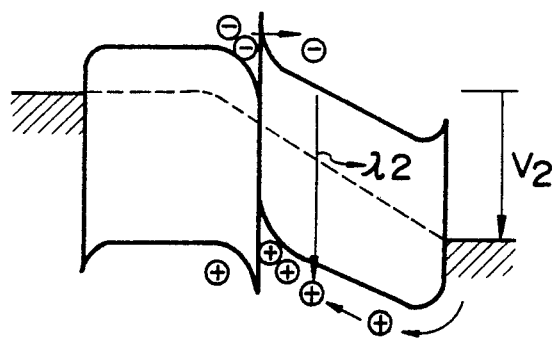
F I G. 13B
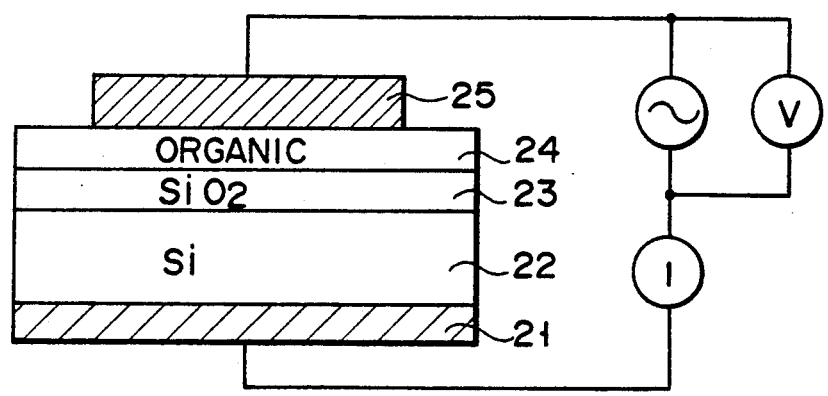
F I G. 14

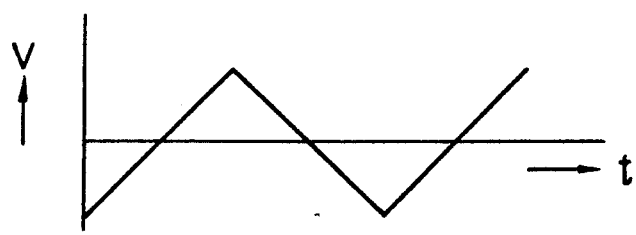
F I G. 15
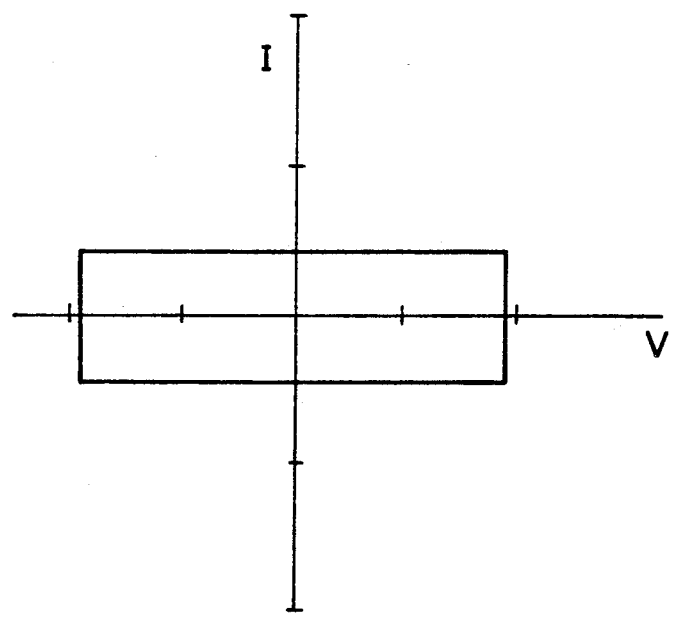
F I G. 16

ORGANIC ELECTROLUMINESCENT DEVICE

BACKGROUND OF THE INVENTION

1. Field of the Invention

The present invention relates to an electroluminescent device (EL device) using an organic film containing an organic dye and, more particularly, to an organic EL device which realizes high-luminance electroluminescence by a combination of a plurality of organic films.

2. Description of the Related Art

In recent years, research and development of an organic EL device to be used as a display device or an illumination device have become a big concern. For example, Shogo Saito at Kyushu University has reported an EL device having an organic film two-layered structure of metal electrode/aromatic dye/polythiophene/transparent electrode (J.J. Appl. Phys. 25, L773, 1986). In this device, the thickness of an organic film is 1 $\mu$m or more, and an application voltage is as high as 100 V. C. W. Tang et al. of Eastman Kodak Co. has reported an EL device having an organic film two-layered structure of Mg.Ag/Alq3/diamine/ITO (Appl. Phys. Lett., 51, p. 913, 1987). According to this report, when the thickness of organic film is 100 nm or less, an EL device which can be driven with an application voltage of 10 V or less to exhibit a practically satisfactory luminance is obtained. These EL devices are based on an organic two-layered structure obtained by combining a dye having an electron injecting property and a dye having a hole injecting property and have characteristic features in that the thickness of an organic film is minimized, a material having a small work function is selected as a metal electrode at an electron injection side, and an organic material is selected so as not to produce an electrical defect when an organic film is formed by a vacuum deposition method or a sublimation method. Shogo Saito at Kyushu University has further proposed an organic three-layered structure of electron injection layer/electroluminescent layer/hole injection layer. This report reveals that high-luminance electroluminescence can be obtained by this structure when a dye having high photoluminescence is selected as the electroluminescent layer (J.J. Appl. Phys., 27, L269, 1988).

In addition, many researches such as a research of an electroluminescent device structure obtained by combining various types of organic films, a research indicating that a certain degree of electroluminescence can be obtained even in a single-layered organic film by mixing an electroluminescent agent and a hole injecting agent, and a research concerning characteristic degradation in Alq3 as an electroluminophor have been reported, and a large number of associated patent applications have been filed.

The organic EL device has almost reached the stage of practical applications in terms of a luminance of electroluminescence but still has many technically unsolved problems in, e.g., a luminous efficacy, a device life, and a device formation process. For example, a luminous efficacy of the device is currently at most 1% and is normally about 0.1%. The low luminous efficacy indicates that a current not contributing to electroluminescent flows between electrodes. This current is a serious cause of a short device life since it generates Joule heat. In order to put the organic EL device into practical use, therefore, the luminous efficacy is desirably increased to at least several to ten percents.

Each organic film of the organic EL device normally consists of a single dye. Since such a dye has an absorption edge from visible to ultraviolet ranges, its band gap is 1.5 eV or more, and almost no carriers are present in each organic film at room temperature. Carriers, therefore, are supplied from metal electrodes to the organic film. In addition, the mobility of carrier moving in the organic dye is generally small. For these reasons, the electrical resistance of the organic dye film is very high. For example, in a device of Tang et al., a current of 10 to 100 mA/cm$^2$ flows with an application voltage of 10 V. In this case, the resistance of the organic film is $5 \times 10^6$ to $10^7$ $\Omega$/cm$^2$. Since the thickness of the organic film is 0.2 mm, its resistivity is as very high as $5 \times 10^6$ to $10^7$ $\Omega$·cm. This high resistance characteristic of the organic film causes a voltage drop of the device and generation of Joule heat and therefore reduces a luminous efficacy or shortens a device life.

For the above reasons, in order to increase the luminous efficacy of the organic EL device, a device structure and electrical properties of a material to be used must be optimized. Since, however, only qualitative properties such as an electron (hole) transport property, an electron (hole) injection property, an electron donor property, an electron acceptor property, and an electroluminescent property have been defined as the properties of an organic material, device conditions are not satisfactorily defined.

SUMMARY OF THE INVENTION

It is, therefore, an object of the present invention to provide an organic EL device in which materials are selected in a combination of metal electrodes and a multilayered structure constituted by a plurality of organic films such that a large number of electrons and holes are injected in the multilayered structure of the organic films and stored therein, thereby realizing high-luminance electroluminescence.

Since an organic film can be considered as a kind of a semiconductor, in a device in which organic films are stacked, electrical characteristics in junction surfaces between the layers define device characteristics. That is, when the work function of a metal electrode and the conduction band level, the Fermi level, and the valence band level of each organic film are taken into consideration, the relationship between the respective levels in each junction surface is important. In view of this, the present invention proposes a high-efficiency EL device structure by using a semiconductor model.

More specifically, an EL device according to the present invention is based on a structure in which a multilayered body of a plurality of organic films including an electroluminescent layer is sandwiched between first and second electrodes.

The first EL device of the present invention has, on the basis of the above basic structure, a structure in which a first organic film is formed in contact with a first electrode, a second organic film is formed in contact with a second electrode, and a third organic film having a band gap set smaller than those of the first and second organic films is sandwiched between the first and second organic films. In addition, an impurity is doped in at least one of the first and second organic films. That is, an impurity having a donor property is doped in the first organic film, and an impurity having an acceptor property is doped in the second organic film. An impurity concentration is $10^{14}$ to $10^{20} cm^3$, and preferably, $10^{17}$ to $10^{19}/cm^3$. No impurity is doped in an organic film serving as an electroluminescent layer.

The above-mentioned conditions of the first EL device will be described in more detail below. Assume that work functions of the first and second electrodes are $E_{M1}$ and $E_{M2}$ respectively, an energy difference (to be simply referred to as a conduction band level hereinafter) of the lower end of a conduction band of the first organic film on the first electrode side from a vacuum level is $E_{C1}$, an energy difference (to be simply referred to as a Fermi level hereinafter) of a Fermi level of the first organic film from a vacuum level is $E_1$, and an energy difference (to be simply referred to as a valence band level hereinafter) of the upper end of a valence band of the first organic film from a vacuum level is $E_{V1}$, and the conduction band level, the Fermi level, and the valence band level of the second organic film on the second electrode side are $E_{C2}$, $E_2$, and $E_{V2}$, respectively. In this case, materials are so selected as to satisfy the following inequalities:

$$E_{M1} - E_{C1} < 0.5 \ [eV] \tag{1}$$

$$E_{V2} - E_{M2} < 0.5 \ [eV] \tag{2}$$

$$E_{C1} > E_{C2} \tag{3}$$

$$E_{V1} > E_{V2} \tag{4}$$

and the following inequalities:

$$E_{C3} > E_{C2} \tag{5}$$

$$E_{V1} > E_{V3} \tag{6}$$

Assuming that the ionization energy of the donor impurity to be doped in the first organic film is Ip, the impurity is so selected as to satisfy the following inequality:

$$Ip - E_{C1} < 1 \ [eV] \tag{7}$$

More preferably, the following inequality is satisfied:

$$Ip - E_{C1} < 0.5 \ [eV] \tag{8}$$

Although the Fermi level $E_1$ of the first organic film approaches the conduction band level $E_{C1}$ by this impurity doping, the relations (1) to (6) are still satisfied.

Assuming that the electron affinity of the acceptor impurity to be doped in the second organic film is EA, the impurity is so selected as to satisfy the following inequality:

$$E_{V2} < E_A < 1 \ [eV] \tag{9}$$

More preferably, the following inequality is satisfied:

$$E_{V2} - E_A < 0.5 \ [eV] \tag{10}$$

Although the Fermi level $E_2$ of the second organic film approaches the valence band level $E_{V2}$, the relations (1) to (6) are still satisfied.

The second EL device of the present invention has, on the basis of the basic structure described above, a structure in which a multilayered structure of first and second organic films for constituting a blocking contact with respect to electrons and holes is sandwiched between first and second electrodes, formed on the first and second organic film sides, for injecting electrons and holes, respectively. When the first organic film is to be used as an electroluminescent layer, an impurity having a donor property is doped in the second organic film. When the second organic film is to be used as an electroluminescent layer, an impurity having an acceptor property is doped in the first organic film. When a bias is applied between the first and second electrodes so that the second electrode serves as a positive electrode, electrons injected from the first electrode into the first organic film or holes injected from the second electrode into the second organic film are stored in the blocking contact. When the bias voltage exceeds a predetermined value, the stored electrons and holes are tunnel-injected in the second and first organic films, respectively, and electroluminescent-recombined.

The conditions of the second EL device will be described in more detail below. As in the first EL device, materials are so selected as to satisfy the following inequalities:

$$E_{M1} - E_{C1} < 0.5 \ [eV] \tag{11}$$

$$E_{V2} - E_{M2} < 0.5 \ [eV] \tag{12}$$

$$E_{C1} > E_{C2} \tag{13}$$

$$E_{V1} > E_{V2} \tag{14}$$

and the following inequalities:

$$E_{M1} < E_1 \tag{15}$$

$$E_2 < E_{M2} \tag{16}$$

When the second organic film is an electroluminescent layer, materials are so selected as to satisfy the following inequality:

$$E_{C1} - E_{C2} < E_{V1} - E_{V2} \tag{17}$$

When the first organic film is an electroluminescent layer, materials are so selected as to satisfy the following inequality:

$$E_{C1} - E_{C2} < E_{V1} - E_{V2} \tag{18}$$

When an acceptor impurity is to be doped in the second organic film or a donor impurity is to be doped in the first organic film, the materials are so selected as to satisfy the relations (7) to (9) above.

In the present invention, examples of the donor impurity to be doped in the organic film are an inorganic material such as an alkali metal, an alkali earth metal, a rare earth element, Al, Ag, Cu, and In, and an organic material such as $NH_3$, an aniline, a phenylenediamine, a benzidine, a triphenylamine, and a TTF. Examples of the acceptor impurity are an inorganic material such as Au, Pt, W, Ir, $POCl_3$, $AsF_6$, Cl, Br, and I, and an organic material such as TCNQ, TCNQF4, chloranyl, bromanyl, DDQ, TNF, DNF, TCNE, and HCNB.

In the first EL device of the present invention, the third organic film having a narrow band gap to serve as an electroluminescent layer is sandwiched between the first and second organic films. When a predetermined bias is applied between the first and second electrodes, therefore, carriers injected from the first and second organic films into the third organic film are confined in the third organic film. This carrier confinement produces electroluminescent recombination with a high efficiency in the electroluminescent layer. In addition, since the first and second organic films are formed into n- and p-type semiconductors having comparatively low resistances upon impurity doping, they can realize electroluminescence with a high efficiency at a low drive voltage.

When materials are actually so selected as to satisfy the above relations in the first EL device, a junction in which electrons are easily injected from the first electrode into the first organic film is formed between the first electrode and the first organic film (relation (1)), and a junction in which holes are easily injected from the second electrode into the second organic film is formed between the second electrode and the second organic film (relation (2)). When a bias voltage is applied between the first and second electrodes such that the second electrode serve as a positive electrode, electrons are injected from the first electrode into the first organic film, and holes are injected from the second electrode into the second organic film. The second organic film serves as a block against the electrons from the first organic film in accordance with the relation (3), the first organic film serves as a block against the holes from the second organic film in accordance with the relation (4), and the electrons and holes are confined in the third organic film in accordance with the relations (5) and (6). As a result, high-efficiency electroluminescence is realized.

In the second EL device of the present invention in which the first and second organic films are directly bonded to each other, when materials are actually so selected as to satisfy the relations described above, a junction in which electrons are easily injected from the first electrode into the first organic film is formed between the first electrode and the first organic film (relation (11)), and a junction in which holes are easily injected from the second electrode into the second organic film is formed between the second electrode and the second organic film (relation (12)). In the junction interface between the first and second organic films, a barrier is formed against the electrons flowing from the first to second organic film (relation (13)), and a barrier is formed against the holes flowing from the second to first organic film (relation (14)). When a bias voltage is applied between the first and second electrodes such that the second electrode serves as a positive electrode, therefore, electrons are injected from the first electrode to the first organic film, holes are injected from the second electrode into the second organic film, and the injected electrons and holes are stored in the junction interface between the first and second organic films to form an electric double layer. When the bias voltage exceeds a predetermined threshold value, the electrons are tunnel-injected from the first to second organic film and recombined with the holes to emit light in the second organic film if the second organic film is an electroluminescent layer. When the bias voltage exceeds another threshold value, the holes are tunnel-injected from the second to first organic film and recombined with the holes to cause electroluminescence in the first organic film if the first organic film is an electroluminescent layer.

In each of the first and second EL devices of the present invention, an impurity is doped in at least one of the first and second organic films in contact with the electrodes to impart properties of an n- or p-type semiconductor to the doped film. As a result, the resistance of an organic film serving as a carrier injecting layer is reduced to decrease a voltage drop upon application of a voltage to the device. Therefore, a high luminous efficacy can be obtained with a low drive voltage. In addition, the reduction in resistance of the organic film serving as the carrier injecting layer reduces Joule heat generated when the device is operated, thereby prolonging the life of the device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a band diagram showing a thermal equilibrium state of the EL device of the first embodiment;

FIG. 3B is a band diagram showing a bias state of the EL device of the first embodiment;

FIG. 5A is a band diagram showing a thermal equilibrium state of the EL device of the second embodiment;

FIG. 5B is a band diagram showing a bias state of the EL device of the second embodiment;

FIG. 12 is a band diagram showing electrical characteristics of layers constituting an organic EL device according to the fifth embodiment of the present invention before bonding;

FIG. 13A is a band diagram showing a small band state of the EL device of the fifth embodiment;

FIG. 13B is a band diagram showing a large bias state of the EL device of the fifth embodiment;

FIG. 14 is a block diagram for explaining a displacement current measuring method of checking characteristics of materials used in the present invention FIG. 15 is a graph showing an application voltage waveform in the method shown in FIG. 14;

FIG. 16 is a graph showing a displacement current-voltage characteristic obtained when no organic film is present;

DETAILED DESCRIPTION OF THE PREFERRED EMBODIMENTS

Figure 1:
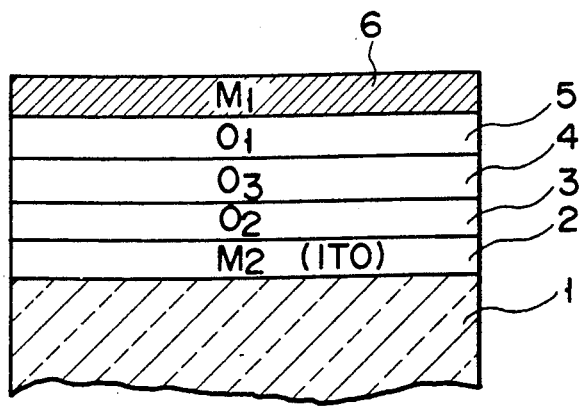
FIG. 1 is a sectional view showing an organic EL device according to the first embodiment of the present invention.

FIG. 1 shows a sectional structure of an organic EL device according to the first embodiment of the present invention. As will be described later, this EL device is obtained by sequentially forming films on a glass substrate 1 by a vacuum deposition method, a vacuum sublimation method, or the like. A three-layered organic film is sandwiched between a first electrode (M1) 6 in an upper portion and a second electrode (M2) 2 in a lower portion. That is, a first organic film (O1) 5 is formed in contact with the first electrode 6, a second organic film (O2) 3 is formed in contact with the second electrode 2, and a third organic film (O3) 4 serving as an electroluminescent layer is sandwiched between the first and second organic films 5 and 3. In this embodiment, the second electrode 2 is a transparent electrode consisting of, e.g., ITO formed on the glass substrate 1. Light emitted from this EL device is extracted through the substrate 1.

Figure 2:
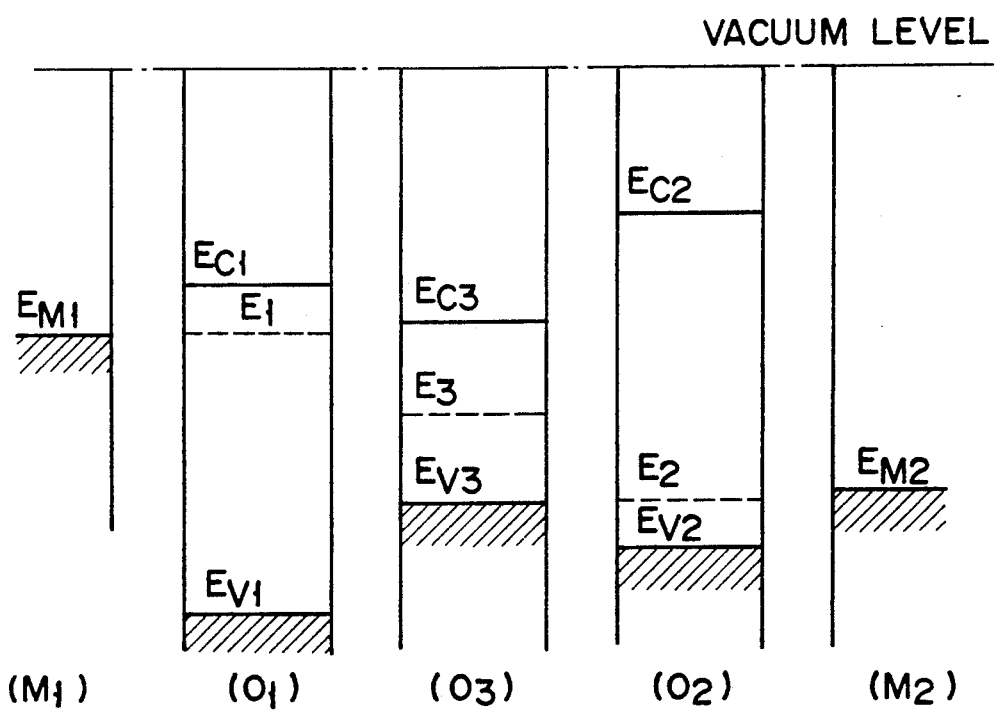
FIG. 2 is a band diagram showing electrical characteristics of layers constituting the EL device of the first embodiment before bonding.

FIG. 2 is a band diagram in which the layers constituting the EL device are illustrated independently of each other. Assuming that the conduction band level, the Fermi level, and the valence band level of the first organic film (O1) 5 are $E_{C1}$, $E_1$, and $EV_1$, respectively, the conduction band level, the Fermi level, and the valence band level of the second organic film (O2) 3 are $E_{C2}$, $E_2$, $E_{V2}$, respectively, and the conduction band level, the Fermi level, and the valence band level of the third organic film (O3) 4 are $E_{C3}$, $E_3$, and $E_{V3}$, respectively, materials are so selected as to satisfy the following inequalities as shown in FIG. 2:

$$E_{C3} > E_{C1} > E_{C2}$$

$$E_{V1} > E_{V2} > E_{V3}$$

The first organic film (O1) 5 is doped with a donor impurity to serve as an n-type semiconductor in which a large number of electrons are generated upon thermal excitation. The second organic film (O2) 3 is doped with an acceptor impurity to serve as a p-type semiconductor in which a large number of holes are generated upon thermal excitation. In addition, a work function $E_{M1}$ of the first electrode (M1) 6 satisfies the following inequality:

$$E_{M1} - E_{C1} < 0.5 \text{ eV}$$

That is, the first electrode 6 is so selected as to facilitate injection of electrons into the first organic film 5. A work function $E_{M2}$ of the second electrode (M2) 2 satisfies the following inequality:

$$E_{V2} - E_{M2} < 0.5 \text{ eV}$$

That is, the second electrode 2 is so selected as to facilitate injections of holes into the second organic film 3.

An operation of the EL device according to the first embodiment w 11 be described below with reference to FIGS. 3A and 3B. FIG. 3A is a band diagram showing a thermal equilibrium state of the EL device of this embodiment. In the thermal equilibrium state, the Fermi levels of systems of the device coincide with each other. In accordance with the magnitude relationship between the work functions of the electrodes and the energy levels of the organic films shown in FIG. 2, therefore, a junction in which electrons are easily injected from the first electrode 6 into the first organic film 5 is formed between the first electrode 6 and the first organic film 5. A junction in which holes are easily injected from the second electrode 2 into the second organic film 3 is formed between the second electrode 2 and the second organic film 3. The third organic film 4 having a band gap smaller than those of the first and second organic films 5 and 3 is sandwiched between the first and second organic films 5 and 3. In this state, the first and second organic films 5 and 3 are depleted.

FIG. 3B is a band diagram of the EL device of this embodiment obtained when a predetermined positive bias voltage V is applied to the second and first electrodes 2 and 6. As shown in FIG. 3B, electrons are injected from the first organic film 5 into the third organic film 4, and holes are injected from the second organic film 3 into the third organic film 4. The injected electrons and holes are confined in the third organic film 4 serving as a potential well with respect to electrons and holes. The electrons and holes confined in the third organic film 4 are recombined to emit light. Since the band gaps of the first and second organic films 5 and 3 are larger than that of the third organic film 4, the light emitted from the film 4 is not absorbed by the films 5 and 3 but is externally extracted.

If a impurity as described above is not doped in the first organic film 5, a voltage corresponding to $E_{M1} - E_{C1}$ is required to inject electrons from the first electrode 6 into the first organic film 5. In addition, a voltage of a certain value is required to move the injected electrons in the organic film 5. Similarly, if an impurity as described above is not doped in the second organic film 3, a voltage corresponding to $E_{V2} - E_{M2}$ is required to inject holes from the second electrode 2 into the second organic film 3. In addition, a voltage of a certain value is required to move the injected holes in the second organic film 3. In this embodiment, however, since the first and second organic films 5 and 3 serve as n- and p-type semiconductors having low resistances, respectively, high-luminance electroluminescence can be obtained while not requiring a high drive voltage.

In order to select materials in which the magnitude relationship between energy levels in each junction surface is set as in the EL device of this embodiment, a method of measuring the magnitude relationship between energy levels is required. For this purpose, a method to be described below found by the present inventors may be used.

As shown in FIG. 14, a device consisting of metal electrode 21/silicon 22/silicon oxide film 23/organic film 24/metal electrode 25 is formed. A triangular-wave voltage as shown in FIG. 15 is applied to this device, and a displacement current generated in the device is measured. Assuming that the capacitance of the device is C, the displacement current is represented by the following equation:

$$I = C \cdot dV/dt$$

If the organic film 24 is omitted from the device shown in FIG. 14, the device is a well-known MOS device. The capacitance of this MOS device is determined by the permittivity and the film thickness of the silicon oxide film 23. If the organic film 24 is present, the following displacement currents are observed in accordance with a magnitude relationship between the Fermi level of the organic film 2 and the work function of the metal electrode 25.

(a) A case wherein the work function of the metal electrode 25 and the Fermi level of the organic film 24 are substantially equal to each other.

In this case, the junction between the metal electrode 25 and the organic film 24 has a high barrier against both electrons and holes. Since the organic film 24 can be considered as an insulator, therefore, the device capacitance is a series capacitance of the silicon oxide film and the organic film and has a predetermined value smaller than that of an ordinary MOS device. Therefore, a displacement current-voltage characteristic obtained upon application of a triangular-wave voltage shown in FIG. 15 to the device indicates a constant displacement current value regardless of the voltage, as shown in FIG. 16.

(b) A case wherein the work function of the metal electrode 25 is smaller than the Fermi level of the organic film 24.

Figure 17:
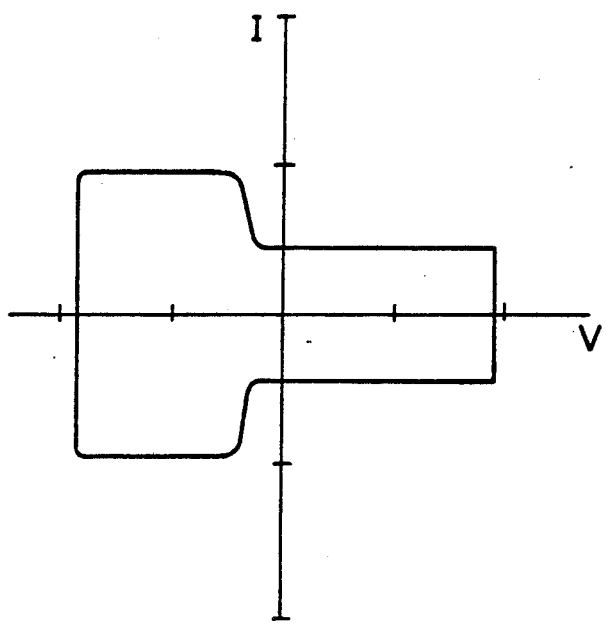
FIG. 17 is a graph showing a displacement current-voltage characteristic of the EL device of the present invention.

In this case, the junction between the metal electrode 25 and the organic film 24 facilitates injection of electrons from the metal electrode 25 into the organic film 24. When the triangular-wave voltage shown in FIG. 15 is applied to the device, therefore, electrons are injected from the metal electrode 25 into the organic film 24 if the metal electrode 25 serves as a negative electrode, and the injected electrons are stored in the interface between the organic film 24 and the oxide film 23. In this state, the value of the device capacitance is determined by the oxide film 23. As shown in FIG. 17, therefore, the displacement current is increased to the level of the ordinary MOS device. When the application voltage has a polarity which causes the metal electrode 25 to serve as a positive electrode, electrons in the organic film 24 flow to the metal electrode 25, and the displacement current is decreased to be a small value obtained when the organic film 24 serves as an insulator.

(c) A case wherein the work function of the metal electrode 25 is larger than the Fermi level of the organic film 24.

Figure 18:
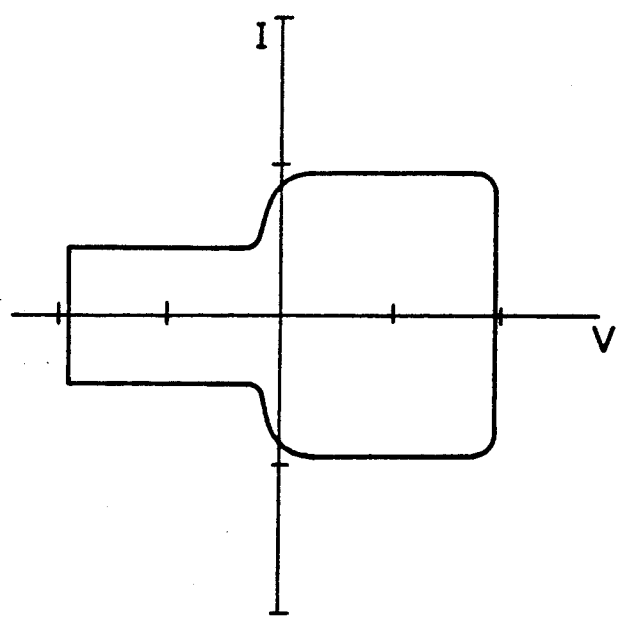
FIG. 18 is a graph showing another displacement current-voltage characteristic.

In this case, the junction between the metal electrode 25 and the organic film 24 facilitates injection of holes from the metal electrode 25 into the organic film 24 When the triangular-wave voltage shown in FIG. 15 is applied to the device, therefore, holes are injected from the metal electrode 25 into the organic film 24 if the metal electrode 25 serves as a positive electrode, and the injected holes are stored in the interface between the organic film 24 and the oxide film 23. In this state, the value of the device capacitance is determined by the oxide film 23, and the displacement current is increased to the level of the ordinary MOS device, as shown in FIG. 18. When the application voltage has a polarity which causes the metal electrode 25 to serve as a negative electrode, holes in the organic film 24 flow to the metal electrode 25, and the displacement current is decreased to be a small value obtained when the organic film 24 serves as an insulator.

In this manner, the displacement current is measured in the device shown in FIG. 14, and the junction state between the metal electrode 25 and the organic film 24 is determined in accordance with whether the measured displacement current corresponds to FIG. 16, 17, or 18.

On the basis of the relationship between a metal electrode and an organic film as described above, displacement current measurement is similarly performed in a multilayered structure of the first and second organic films instead of the organic film 24 of the device structure shown in the FIG. 14. As a result, a relationship between the conduction band levels, the Fermi levels, and the valence band levels of the two organic films is revealed.

For example, in the device structure shown in FIG. 14, assume that the organic film 24 has a two-layered structure constituted by a first organic film 241 in contact with the metal electrode 25 and a second organic film 242 formed below the first organic film 241, and that electrons are injected from the metal electrode 25 into the first organic film 241. This phenomenon is already checked in a device structure having a single-layered organic film. If a displacement current flows up to an ordinary MOS device level while the metal electrode 25 serves as a negative electrode, the electrons injected in the first organic film 241 are further injected into the second organic film 242. As a result, it is confirmed that the conduction band level of the second organic film 242 is lower than that of the first organic film 241. If such a displacement current at the MOS device level is not observed, the conduction band level of the second organic film 242 is higher than that of the first organic film 241.

A magnitude relationship between the valence band levels can be determined by similar displacement current measurement using hole injection.

An organic EL device using the device structure shown in FIG. 1 will be described in more detail below.

In the device shown in FIG. 1,

1st electrode 6: Erbium film
1st organic film 5: 9, 9'-bis (dicyanomethylene) bifluorenyl

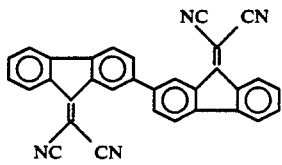

2nd organic film 3: 9, 10-bis (2-cyano-2-ethoxycarbonyl-vinylene) anthracene

-continued

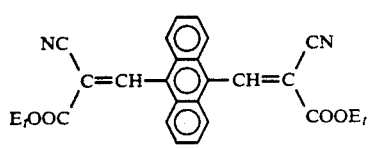

3rd organic film 4: tri (4-ditorylaminophenyl) methane

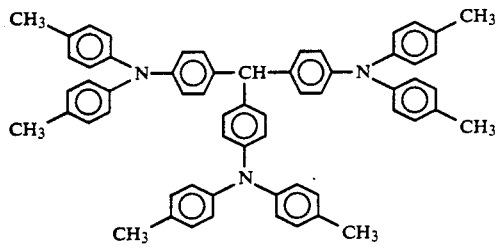

2nd electrode 2: ITO film were used. Metal potassium was doped as an impurity in the first organic film 5, and chloranyl was doped as an impurity in the second organic film 3.

It is confirmed on the basis of the displacement current measurement method that this material system satisfies the conditions shown in FIG. 2. The device formation process was as follows. The second organic film 3 was formed to have a thickness of 20 to 100 nm by a vacuum sublimation method (vacuum degree=$10^{-6}$ Torr) on a glass substrate having the ITO film, the third and first organic films 4 and 5 were sequentially formed to have a thickness of 20 to 100 nm each by a similar vacuum sublimation method, and the erbium film was formed to have a thickness of 20 to 100 nm by a vacuum deposition method. Note that impurity doping in the second organic film 3 was performed by sublimating chloranyl impurity together with a organic material. Impurity doping in the first organic film 5 was performed as follows. That is, predetermined amounts of an organic material and potassium iodide were dissolved in an acetonitrile solution. Acetonitrile in the resultant solution was evaporated to obtain a potassium-doped organic crystal residue. This organic crystal residue was used to form a film by a sublimation method.

When a bias having a polarity which caused the ITO electrode to serve as a positive electrode was applied to the obtained device, a current of about 12 mA flowed at a voltage of 5 V, and electroluminescence with a luminance of about 1,000 Cd/m² was observed. A luminous efficacy was about 10%.

Two embodiments based on the device structure shown in FIG. 1 and using different material systems will be described below.

Figure 4:
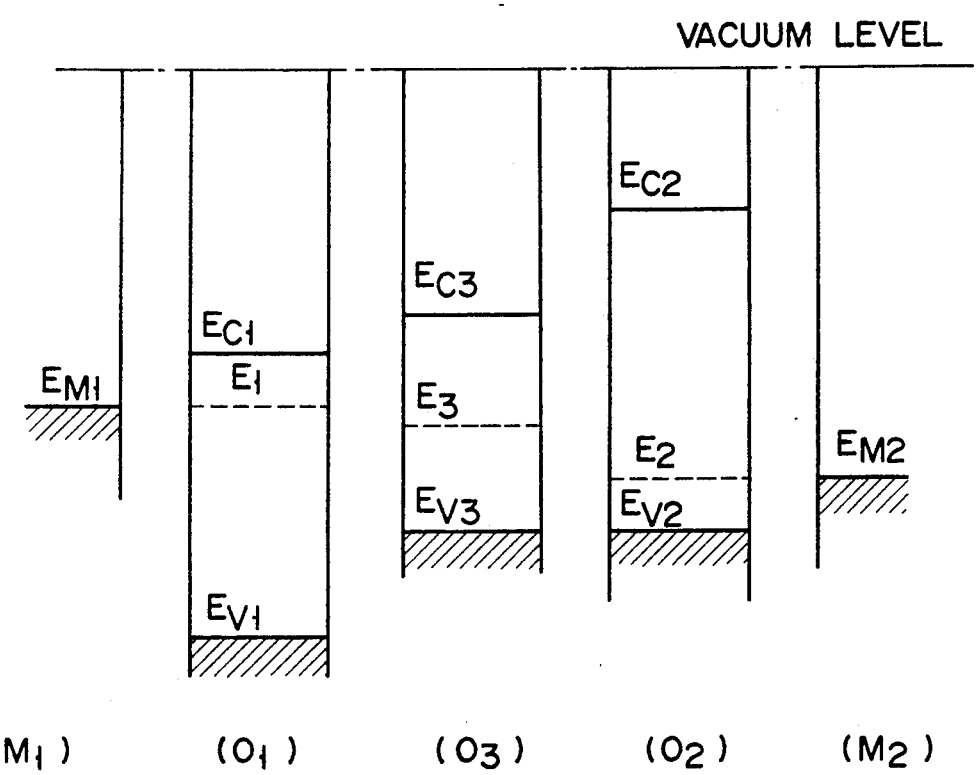
FIG. 4 is a band diagram showing electrical characteristics of layers constituting an organic EL device according to the second embodiment of the present invention before bonding.

FIG. 4 shows a band diagram of layers constituting one EL device before bonding in correspondence with FIG. 2. In this embodiment, as is apparent from comparison between FIGS. 2 and 4, a condition of:

$$E_{V2} \approx E_{V3}$$

is satisfied between a second organic film 3 and a third organic film 4, and a condition of:

$$E_{C1} > E_{C3}$$

is satisfied between a first organic film 5 and a third organic film 4. Other conditions are the same as those in the first embodiment.

FIGS. 5A and 5B are views for explaining an operation of the organic EL device of this embodiment. FIG. 5A is a band diagram showing a thermal equilibrium state. In this embodiment, as shown in FIG. 5A, a barrier represented by:

$$\Delta E_C = E_{C1} - E_{C3}$$

is formed between the first and third organic films 5 and 4 against electrons flowing from the third organic film 4 into the first organic film 5. This barrier against electrons is smaller than a barrier represented by:

$$\Delta E_V = E_{V1} - E_{V3}$$

against a flow of holes from the third organic film 4 to the first organic film 5.

FIG. 5B shows a state in which a forward bias is applied to the EL device of this embodiment. Electrons in the first organic film 5 are stored in the blocking contact portion between the first and third organic films 5 and 4, and holes in the second organic film 3 flow to the third organic film 4 and are stored in the blocking contact portion between the third and first organic films 4 and 5. The carriers stored in the junction portion between the first and third organic films 5 and 4 form an electric double layer. The thickness of the electric double layer is a intermolecular distance ($\approx$1 nm) of an organic dye. As a result, a large electric field of about $10^7$ V/cm or more is formed. The electrons in the first organic film 5 are tunnel-injected into the third organic film 4 by this strong electric field and electroluminescent-recombined in the film 4.

Figure 6:
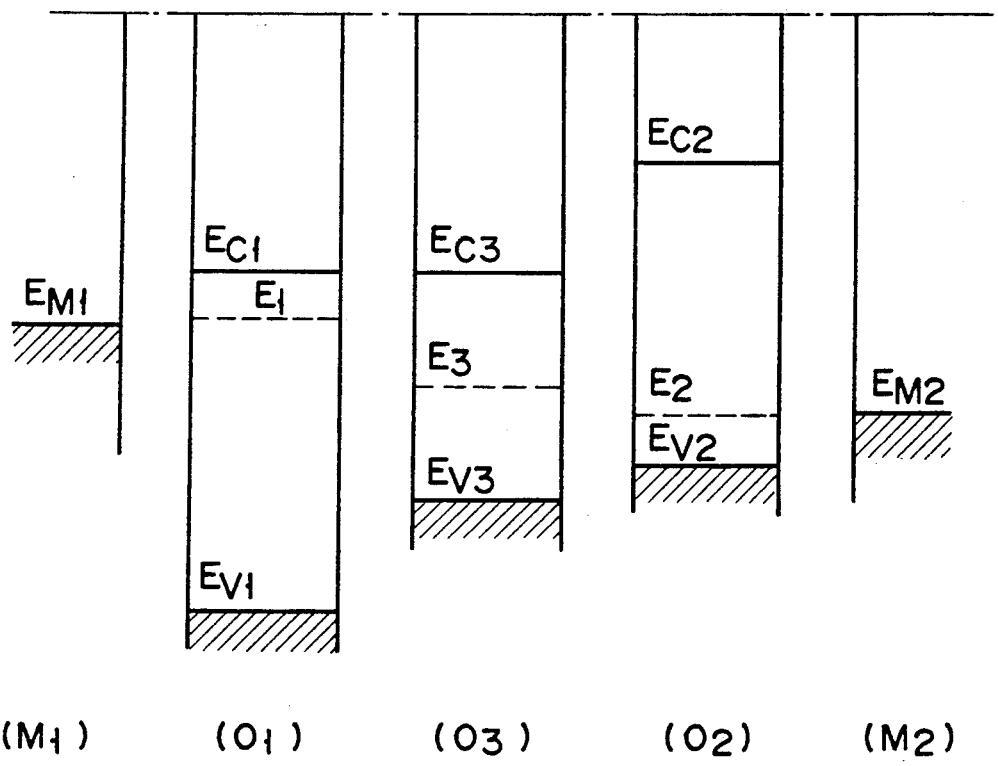
FIG. 6 is a band diagram showing electrical characteristics of layers constituting an organic EL device according to the third embodiment of the present invention before bonding.

FIG. 6 is a band diagram showing layers constituting the other device before bonding. In this embodiment, as shown in FIG. 6, conditions of:

$$E_{C1} \approx E_{C3}$$

$$E_{V2} < E_{V3}$$

are satisfied between a second organic film 3 and a third organic film 4.

Figure 7A:
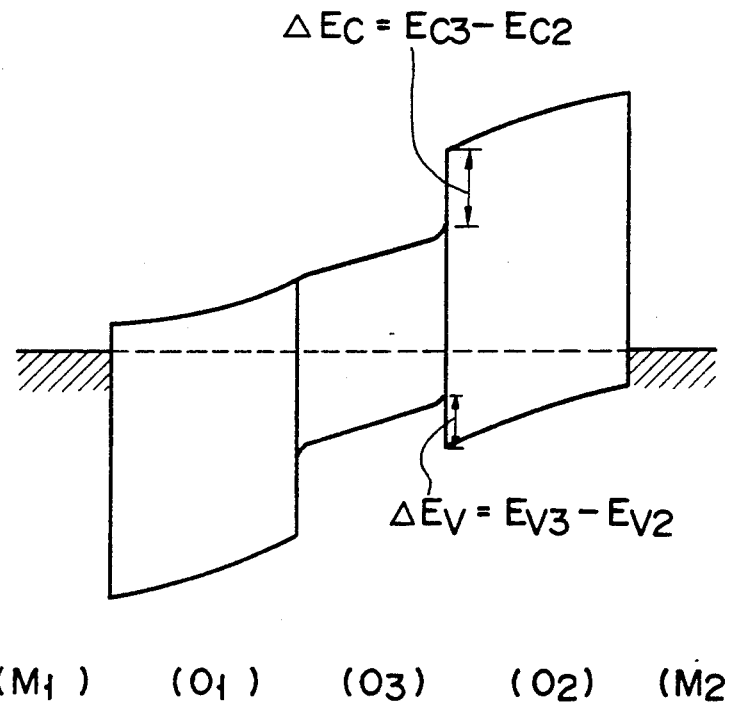
FIG. 7A is a band diagram showing a thermal equilibrium state of the EL device of the third embodiment.
Figure 7B:
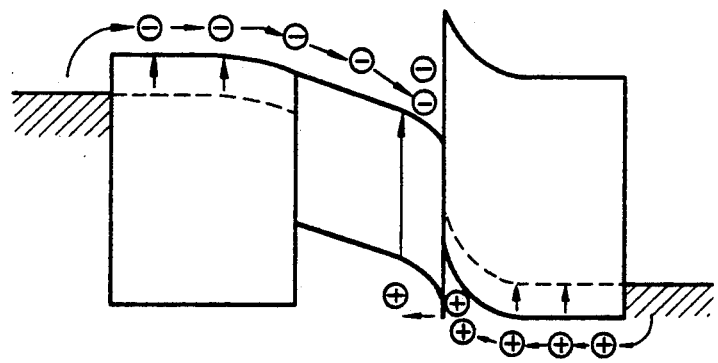
FIG. 7B is a band diagram showing a bias state of the EL device of the third embodiment.

FIGS. 7A and 7B are views for explaining an operation of the organic EL device of this embodiment. FIG. 7A is a band diagram showing a thermal equilibrium state. In this embodiment, as shown in FIG. 7A, a barrier represented by:

$$\Delta E_V = E_{V3} - E_{V2}$$

is formed between the second and third organic films 3 and 4 against a flow of holes from the third organic film 4 to the second organic film 3. This barrier against holes is smaller than a barrier represented by:

$$\Delta E_C = E_{C3} - E_{C2}$$

against a flow of electrons from the third organic film 4 to the second organic film 3. FIG. 7B shows a state in which a forward bias is applied to the EL device of this embodiment. Electrons injected from a first organic film 5 into the third organic film 4 are stored in the barrier junction portion between the third and second organic films 4 and 3. Holes in the second organic film 3 are stored in the barrier junction portion between the second and third organic films 3 and 4. The carriers stored in the junction portion between the second and third organic films 3 and 4 form an electric double layer. When the bias voltage exceeds a predetermined value, the holes in the second organic film 3 are tunnel-injected into the third organic film 4 and electroluminescent-recombined in the film 4.

In each of these embodiments, a large number of carriers are confined in the third organic film, and electroluminescence with a high efficiency can be obtained.

The embodiments of the EL device having an organic film three-layered structure have been described above. Embodiments of an EL device having an organic film two-layered structure will be described below.

Figure 8:
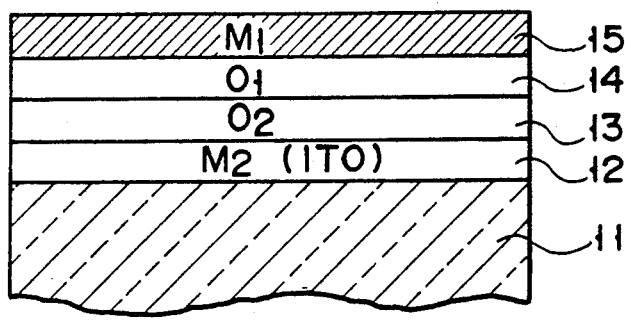
FIG. 8 is a sectional view showing an organic EL device according to the fourth embodiment of the present invention.

FIG. 8 shows a sectional structure of an EL device according to an embodiment of the organic film two-layered structure. This device is constituted by a first electrode (M1) 15, a first organic film (O1) 14, a second organic film (O2) 13, and a second electrode (M2) 12 sequentially from its upper portion. Also in this embodiment, the second electrode 12 is a transparent electrode consisting of ITO formed on a glass substrate 11, and light is extracted through the substrate 11. A compound semiconductor can be used as the transparent electrode. A manufacturing process of this device is the same as that for the above embodiments.

Figure 9:
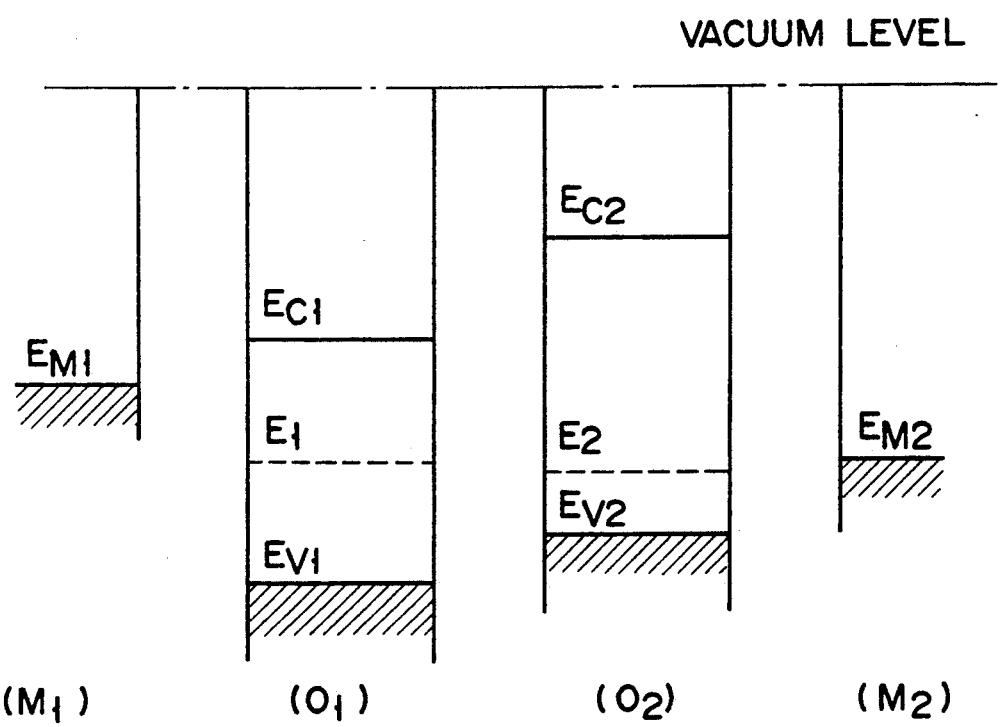
FIG. 9 is a band diagram showing electrical characteristics of layers constituting the EL device of the fourth embodiment before bonding.

FIG. 9 is a band diagram in which the layers constituting the EL device of this embodiment are illustrated independently of each other. Referring to FIG. 9, the first organic film 14 is an electroluminescent layer not doped with an impurity, and the second organic film 13 is doped with an acceptor impurity. Assuming that the conduction band level, the Fermi level, and the valence band level of the first organic film 14 are $EC_1$, $E_1$, and $E_{V1}$, respectively, and the conduction band level, the Fermi level, and the valence band level of the second organic film 13 are $E_{C2}$, $E_2$, $E_{V2}$, respectively, materials are so selected as to satisfy $E_{V1} > E_{V2}$, and $E_{C1} > E_{C2}$. The Fermi level $E_1$ of the first organic film 14 serving as an electroluminescent layer is located at substantially the center of a forbidden band width. An acceptor impurity having an electron affinity EA which satisfies the following inequality:

$$E_{V2} - E_A < 1 \text{ eV}$$

is doped at a concentration of $10^{18}/\text{cm}^3$ in the second organic film 13. As a result, the Fermi level $E_2$ of the second organic film 13 approaches close to the valence band level $E_{V2}$. That is, a certain amount of holes are excited at room temperature in the second organic film 13. The first electrode 15 having a work function $E_{M1}$ which satisfies $E_{M1} < E_1$ is so selected as to facilitate injection of electrons into the first organic film 14. The second electrode 12 having a work function $E_{M2}$ which satisfies $E_{M2} > E_2$ is so selected as to facilitate injection of holes into the second organic film 13.

Figure 10:
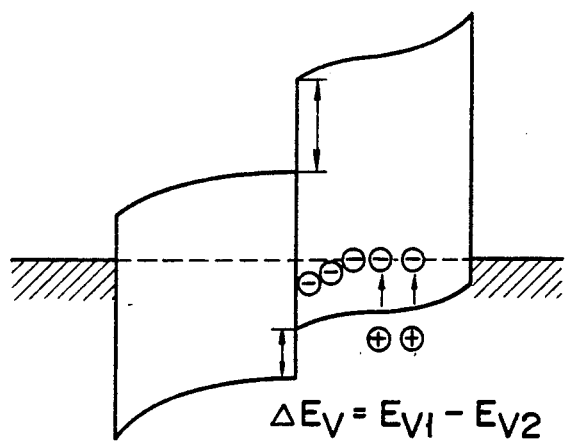
FIG. 10 is a band diagram showing a thermal equilibrium state of the EL device of the fourth embodiment.

FIG. 10 is a band diagram showing a thermal equilibrium state of the EL device in which the above layers are bonded to each other. The Fermi levels of the system coincide with each other in the thermal equilibrium state. In accordance with the magnitude relationship between the work functions of the electrodes and the energy levels of the respective organic films, a junction in which electrons are easily injected from the first electrode 15 into the first organic film 1 is formed between the electrode 15 and the film 14, as shown in FIG. 10. A junction in which holes are easily injected from the second electrode 12 into the second organic film 13 is formed between the electrode 12 and the film 13. A barrier represented by $\Delta E_C = E_{C1} - E_{C2}$ is formed in the conduction band and a barrier represented by $\Delta E_V = E_{V1} - E_{V2}$ is formed in the valence band between the first organic film 14 and the second organic film 13. These barriers in the conduction band and valence band satisfy the following relation:

$$\Delta E_V < \Delta E_C$$

Figure 11A:
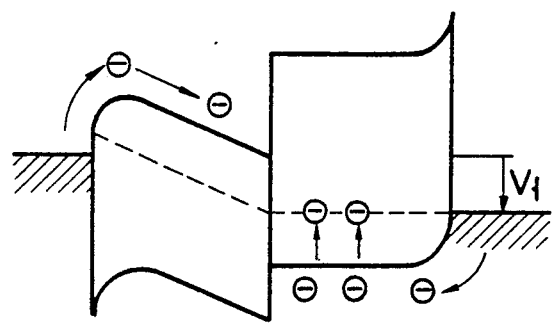
FIG. 11A is a band diagram showing a small bias state of the EL device of the fourth embodiment.
Figure 11B:
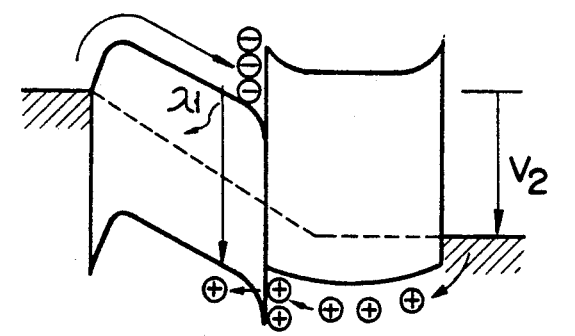
FIG. 11B is a band diagram showing a large bias state of the EL device of the fourth embodiment.

An operation principle of the EL device of this embodiment will be described below with reference to FIGS. 11A and 11B. FIG. 11A is a band diagram showing a state in which a certain bias voltage V1 which causes the second electrode 12 to be a positive electrode with respect to the first electrode 15 is applied. In this case, most of the application voltage is applied to the insulating first organic film 14. Therefore, electrons are injected from the first electrode 15 into the first organic film 14. Holes as major carriers in the second organic film 13 are concentrated in the barrier junction interface between the first and second organic films 14 and 13. As a result, an electric double layer is formed in the interface between the first and second organic films 14 and 13. When the bias voltage becomes $V_2$ beyond a predetermined threshold value as shown in FIG. 11B, of the electrons and holes constituting the electric double layer, the holes are tunnel-injected from the second organic film 13 into the first organic film 14. This is because the barrier against the holes is lower than the barrier against the electrons. The holes injected from the second organic film 13 into the first organic film 14 are recombined with electrons as major carriers in the film 14, thereby emitting light having a first wavelength $\lambda 1$.

FIG. 12 is a band diagram corresponding to FIG. 9, showing layers before bonding of an EL device according to an embodiment in which a first organic film 14 is doped with a donor impurity and a second organic film 13 is not doped with an impurity to serve as an electroluminescent layer in the structure shown in FIG. 8. In this embodiment, materials of the organic films are so selected as to satisfy the following relation:

$$E_{C1} - E_{C2} < E_{V1} - E_{V2}$$

A donor impurity having an ionization energy which satisfies the following inequality:

$$I_p - E_{C1} < 1 \text{ eV}$$

is doped at a concentration of $10^{18}/\text{cm}^3$ in the first organic film 14. As a result, a Fermi level $E_1$ of the first organic film 14 is close to a conduction band level $E_{C1}$. Similar to the above embodiment, a first electrode 15 is so selected a to facilitate injection of electrons into the first organic film 14, and a second electrode 12 is so selected a to facilitate injection of holes into the second organic film 13.

An electroluminescent operation of the EL device of this embodiment will be described below with reference to FIGS. 13A and 13B. When a bias voltage V1 which causes the second electrode 12 to be a positive electrode with respect to the first electrode 15 is applied, most of the voltage is applied to the second organic film 13, as shown in FIG. 13A, because the film 13 is insulative in this embodiment. Holes injected from the second electrode 12 into the second organic film 13 are transported to the barrier interface portion with respect to the first organic film 14. As a result, an electric double layer is formed between the first and second organic films 14 and 13. Electrons in the first organic film 14 are concentrated in the barrier interface with respect to the second organic film 13. When the application voltage becomes V2 beyond a predetermined threshold value, the electrons in the first organic film 14 are tunnel-injected into the second organic film 13 through the barrier, as shown in FIG. 13B. These electrons are electroluminescent-recombined in the organic film 13 to emit light having a wavelength 12 determined by the film 13.

Embodiments of the EL device having the above organic film two-layered structure will be described more in detail below.

In the device shown in FIG. 8,

1st electrode 15: erbium film
1st organic film 14: 9,10-bis
(2-cyano-2-ethoxycarbonyl-vinylene) anthracene

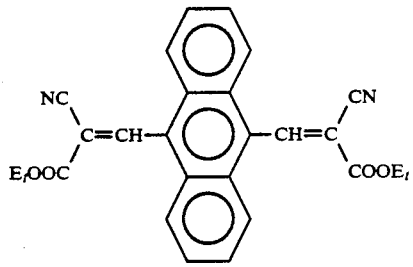

2nd organic film 13: biscarbazoyl triphenyl methane

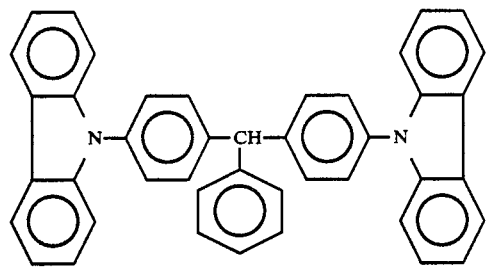

2nd electrode 12: ITO film were used. It is confirmed by the displacement current measurement method described above that this material system satisfied the conditions shown in FIG. 9 and a condition of $E_{C1}-E_{C2} < E_{V1}-E_{V2}$. A device formation process is as follows. That is, an organic film material and DDQ as an impurity were simultaneously sublimated by a vacuum sublimation method (vacuum degree = $10^{-6}$ Torr) on a glass substrate having an ITO film, thereby forming a 100-nm thick second organic film. An impurity concentration obtained by analysis was about $10^{18}/cm^3$. A 100-nm thick first organic film was formed on the second organic film by a similar vacuum sublimation method, and a 100-nm thick erbium film was formed by a vacuum deposition method.

When a bias which caused the ITO electrode to be a positive electrode was applied to the obtained device, a current of 5 mA flowed at a voltage of 3 V, and orange electroluminescence having a luminance of 500 Cd/m² was observed. This electroluminescence was obtained by the first organic film.

In addition, in the device shown in FIG. 9,
1st electrode 15: erbium film
1st organic film: bis(dicyano-9-fluorenonyl)ethane
2nd organic film: bipyrenyl
2nd electrode: ITO film
were used to form a device. Metal sodium was doped as an impurity in the first organic film.

It was confirmed by the above displacement current measurement method that the obtained device satisfied the conditions shown in FIG. 12. A device formation process was as the same as that of the above embodiment.

When a bias was applied to this device, a current of about 5 mA flowed at 5 V, and blue electroluminescence having a luminance of 1,000 Cd/m² was observed. This electroluminescence was obtained by the second organic film.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An organic electroluminescent device comprising: first and second electrodes opposing each other:
   a first organic film formed in contact with said first electrode and doped with a donor impurity;
   a second organic film formed in contact with said second electrode and doped with an acceptor impurity; and
   a third organic film sandwiched between said first and second organic films, serving as an electroluminescent layer, having a band gap narrower than those of said first and second organic films and not doped with an impurity.

2. An organic electroluminescent device according to claim 1, wherein assuming that
   a work function of said first electrode is $E_{M1}$,
   a work function of said second electrode is $E_{M2}$,
   energy differences of a lower end of a conduction band, a Fermi level, and an upper end of a valence band of said first organic film from a vacuum level are $E_{C1}$, $E_1$, $E_{V1}$, respectively,
   energy differences of a lower end of a conduction band, a Fermi level, and an upper end of a valence band of said second organic film from a vacuum level are $E_{C2}$, $E_2$, and $E_{V2}$, respectively, and
   energy differences of a lower end of a conduction band, a Fermi level, and an upper end of a valence band of said third organic film from a vacuum level are $E_{C3}$, $E_3$, $E_{V3}$, respectively, $$E_{M1} < E_1, \quad E_{M1} - E_{C1} < 0.5 \text{ eV}$$

$$E_2 < E_{M2}, \quad E_{V2} - E_{M2} < 0.5 \text{ eV}$$

$$E_{C1} > E_{C2}$$

$$E_{V1} > E_{C3}$$

$$E_{C3} > E_{C2}$$

$E_{V1} > E_{V3}$ are satisfied.

3. An organic electroluminescent device according to claim 2, wherein said first, second, and third organic films satisfy relations of:

$$E_{C3} > E_{C1} > E_{C2}$$

$$E_{V1} > E_{V2} > E_{V3}$$

4. A organic electroluminescent device according to claim 2, wherein said first, second, and third organic films satisfy relations of:

$$E_{V2} \approx E_{V3}$$

$$E_{C1} > E_{C3}$$

$$E_{C1} - E_{C3} < E_{V1} - E_{V3}$$

5. An organic electroluminescent device according to claim 2, wherein said first, second, and third organic films satisfy relations of:

$$E_{C1} \approx E_{C3}$$

$$E_{V2} < E_{V3}$$

$$E_{C3} - E_{C2} > E_{V3} - E_{V2}$$

6. An organic electroluminescent device according to claim 2, wherein an impurity to be doped in said first organic film is a material which satisfies a relation of:

$$Ip - E_{C1} < eV$$

assuming that an ionization energy of said impurity is Ip.

7. An organic electroluminescent device according to claim 2, wherein an impurity to be doped in said second organic film is an inorganic or organic material which satisfies a relation of:

$$E_{V2} - E_A < 1 eV$$

assuming that an electron affinity of said impurity is $E_A$.

8. An organic electroluminescent device comprising:
a multilayered body constituted by a first organic film not doped with an impurity and serving as an electroluminescent layer, and a second organic film forming a blocking contact with respect to said first organic film and doped with an acceptor impurity;
a first electrode, formed on the first organic film side of said multilayered body, for injecting electrons; and
a second electrode, formed on the second organic film side of said multilayered body, for injecting holes.

9. An organic electroluminescent device according to claim 8, wherein an impurity to be doped in said second organic film is a which satisfies a relation of:

$$E_{V2} - E_A < 1 eV$$

assuming that an electron affinity of said impurity is $E_A$ and an energy difference of an upper end of a valence band of said second organic film from a vacuum level is $E_{V2}$.

10. An organic electroluminescent device comprising:
a multilayered body constituted by a first organic film doped with a donor impurity, and a second organic film forming a blocking contact with respect to said first organic film, not doped with an impurity, and serving as an electroluminescent layer;
a first electrode, formed on the first organic film side of said multilayered body, for injecting electrons; and
a second electrode, formed on the second organic film side of said multilayered structure, for injecting holes.

11. An organic electroluminescent device according to claim 10, wherein an impurity to be doped in said first organic film is a material which satisfies a relation of:

$$Ip - E_{C1} < 1 eV$$

assuming that an ionization energy of said impurity is Ip and an energy difference of a lower end of a conduction band of said first organic film from a vacuum level is $E_{C1}$.

* * * * *